(12) United States Patent
Herrault et al.

(10) Patent No.: US 11,756,848 B1
(45) Date of Patent: Sep. 12, 2023

(54) CHIP INTEGRATION INTO CAVITIES OF A HOST WAFER USING LATERAL DIELECTRIC MATERIAL BONDING

(71) Applicant: PseudolithIC, Inc., Santa Barbara, CA (US)

(72) Inventors: Florian Herrault, Agoura Hills, CA (US); Isaac Rivera, Buena Park, CA (US); Daniel S. Green, McLean, VA (US); James F. Buckwalter, Santa Barbara, CA (US)

(73) Assignee: PseudolithIC, Inc., Santa Barbara, CA (US)

( * ) Notice: Subject to any disclaimer, the term of this patent is extended or adjusted under 35 U.S.C. 154(b) by 0 days.

(21) Appl. No.: 18/155,607

(22) Filed: Jan. 17, 2023

(51) Int. Cl.
*H01L 21/56* (2006.01)
*H01L 23/31* (2006.01)
*H01L 23/00* (2006.01)

(52) U.S. Cl.
CPC ........ *H01L 23/3114* (2013.01); *H01L 21/561* (2013.01); *H01L 24/96* (2013.01); *H01L 2224/96* (2013.01)

(58) Field of Classification Search
None
See application file for complete search history.

(56) References Cited

U.S. PATENT DOCUMENTS

| | | |
|---|---|---|
| 8,617,927 B1 | 12/2013 | Margomenos et al. |
| 9,214,404 B1 | 12/2015 | Margomenos et al. |
| 9,385,083 B1 | 7/2016 | Herrault et al. |
| 9,837,372 B1 | 12/2017 | Herrault et al. |
| 10,026,672 B1 | 7/2018 | Herrault et al. |
| 10,079,160 B1 * | 9/2018 | Margomenos ...... H01L 21/4871 |
| 10,483,184 B1 | 11/2019 | Terrault et al. |
| 10,957,537 B2 | 3/2021 | Herrault |
| 10,998,273 B2 | 5/2021 | Herrault et al. |
| 11,158,520 B2 | 10/2021 | Herrault |
| 2011/0215444 A1 * | 9/2011 | Park ............ H01L 23/58 257/629 |
| 2013/0277851 A1 * | 10/2013 | Lin ............ H01L 24/97 257/773 |
| 2014/0103527 A1 * | 4/2014 | Marimuthu ...... H01L 21/486 257/737 |
| 2016/0155702 A1 * | 6/2016 | Chen ........... H01L 21/568 438/126 |
| 2019/0259717 A1 * | 8/2019 | Dadvand ........ H01L 24/03 |
| 2019/0287951 A1 * | 9/2019 | Kim ............ H01L 24/96 |

* cited by examiner

*Primary Examiner* — Jay C Chang
(74) *Attorney, Agent, or Firm* — SoCal IP Law Group LLP; Angelo J. Gaz; Steven C. Sereboff (57) ABSTRACT

An electronic assembly has a backside capping layer, a host wafer having a back surface bonded to a top surface of the backside capping layer except for cavities in the wafer formed over areas of the backside capping layer, the cavities having side surfaces of the wafer. Chiplets have backsides bonded directly to at least portion of the areas of the top surface of the backside capping layer. A lateral dielectric material between side surfaces of the chiplets and side surfaces of the wafer, mechano-chemically bonds the side surfaces of the chiplets to the side surfaces of the wafer.

13 Claims, 6 Drawing Sheets

CHIP INTEGRATION INTO CAVITIES OF A HOST WAFER USING LATERAL DIELECTRIC MATERIAL BONDING

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to a host wafer having circuitry and at least one chip (or chiplet) within and laterally bonded to the sidewalls of at least one cavity of the wafer using a dielectric material, such as where the wafer and chip are fabricated separately.

Description of the Related Art

Electronic assemblies, or hybrid circuits, comprise microelectronic circuits fabricated separately and assembled together so as to form a single component, which can itself be encapsulated in an electronic circuit package. Assembling microelectronic circuits fabricated separately allows, for example, testing of all the microelectronic circuits separately, prior to assembling them, which, in turn enables improved fabrication yields of the final component. This capability is particularly significant if some of the microelectronic circuits fabricated separately are difficult and/or expensive to manufacture. Assembling microelectronic circuits fabricated separately also allows combining of microelectronic circuits, which themselves employ different materials and different manufacturing processes, into a single final component. This capability can lead to higher circuit performance. There exists a need for an electronic assembly using a host wafer having pre-fabricated interconnects and integrated circuitry, such as passive components, that connect to a wafer level microelectronics active chiplet (i.e., with transistors) integrated in a through-wafer cavity of the host wafer. This need may for example be for an assembly for microwave or other radio frequency (RF) integrated circuits that decouple the fabrication of the active circuits (e.g., fabrication of the transistors) from the fabrication of the passive circuits (e.g., fabrication of the interconnects, resistors and capacitors). Satisfying this need will allow for much faster manufacturing of the circuits, at lower cost, and a scaling up of active device technologies to circuits without cost and cycle time burden.

Throughout this description, elements appearing in figures are assigned three-digit or four-digit reference designators, where the two least significant digits are specific to the element and the one or two most significant digit may be the figure number where the element is first introduced or fabricated. An element that is not described in conjunction with a figure may be presumed to have the same characteristics and function as a previously-described or subsequently-described element having the same reference designator.

DETAILED DESCRIPTION

Description of Apparatus

The following describes improved wafers, die, chips and fabrication techniques thereof for electronic assemblies having in-substrate chip (e.g., chiplet) integration into wafer cavities of a host wafer using lateral dielectric material. The host wafer can have pre-fabricated interconnects and integrated circuitry, such as passive components, that connect to a chiplet level microelectronics transistor chip integrated in a through-wafer cavity of the wafer. This may form an assembly for integrated circuit devices where the chips contain active circuits from at least one semiconductor technology and the wafers contain passive (or active) circuits from another semiconductor technology (often a cheaper and larger scale technology). Using a low-cost large-diameter integration platform for the chips with active devices allows for much faster manufacturing of the assembled circuits, at larger scale and lower cost.

The electronic assembled circuit may integrate chiplets having one type of components into a carrier wafer having a different type of components. The electronic assembled circuit may integrate chiplets having high-performance integrated circuits, such as Gallium Nitride (GaN) radio frequency (RF) integrated circuits (ICs) into host wafers having other integrated circuits, such as silicon-based integrated circuits, in a manner that is inexpensive and has high manufacturing yields and short manufacturing cycles. The high performance RF ICs, chips (or chiplets) can have type III-V transistors or other types of transistors and passives, and can be integrated together with resistors, inductors, capacitors and matching networks, as well as active devices from another semiconductor technology into the host wafer. For example, the RF ICs can be one type of semiconductor technology that is integrated together with resistors, inductors, capacitors, matching networks, active devices from another semiconductor technology that are part of the host wafer. A chiplet may be a chip including the circuitry, material, and/or devices noted above in this paragraph. It may also be a chip or small chip having active microelectronic (i.e., transistor) devices, CMOS devices, microwave IC devices and/or radio frequency (RF) IC devices. It may also be a chip or small chip having a SAW, BAW or other acoustic wave device. A chiplet may have a footprint or top surface area that is half, a third a fifth or less than a fifth of that of a computer processor chip (e.g., 8086, P3, P4, etc.).

Figure 1A:
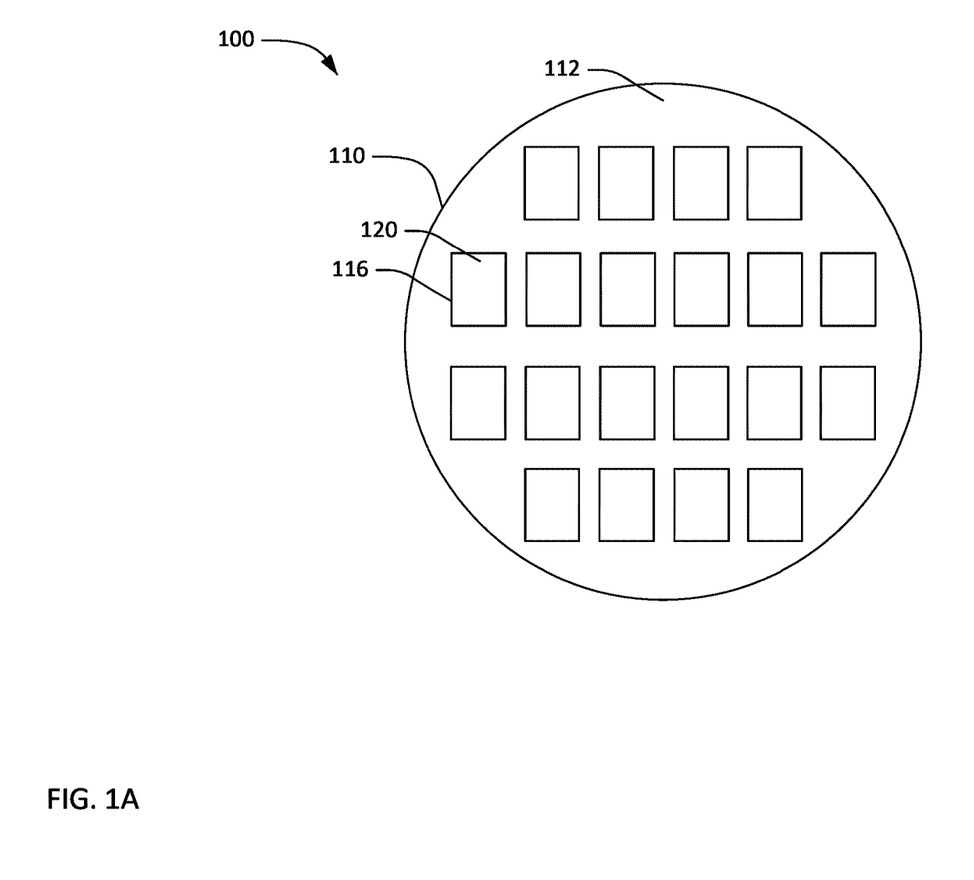
FIG. 1A is a schematic top view of a host wafer having cavities for in-substrate chiplet integration into wafer cavities of a host wafer using lateral dielectric material.
Figure 2:
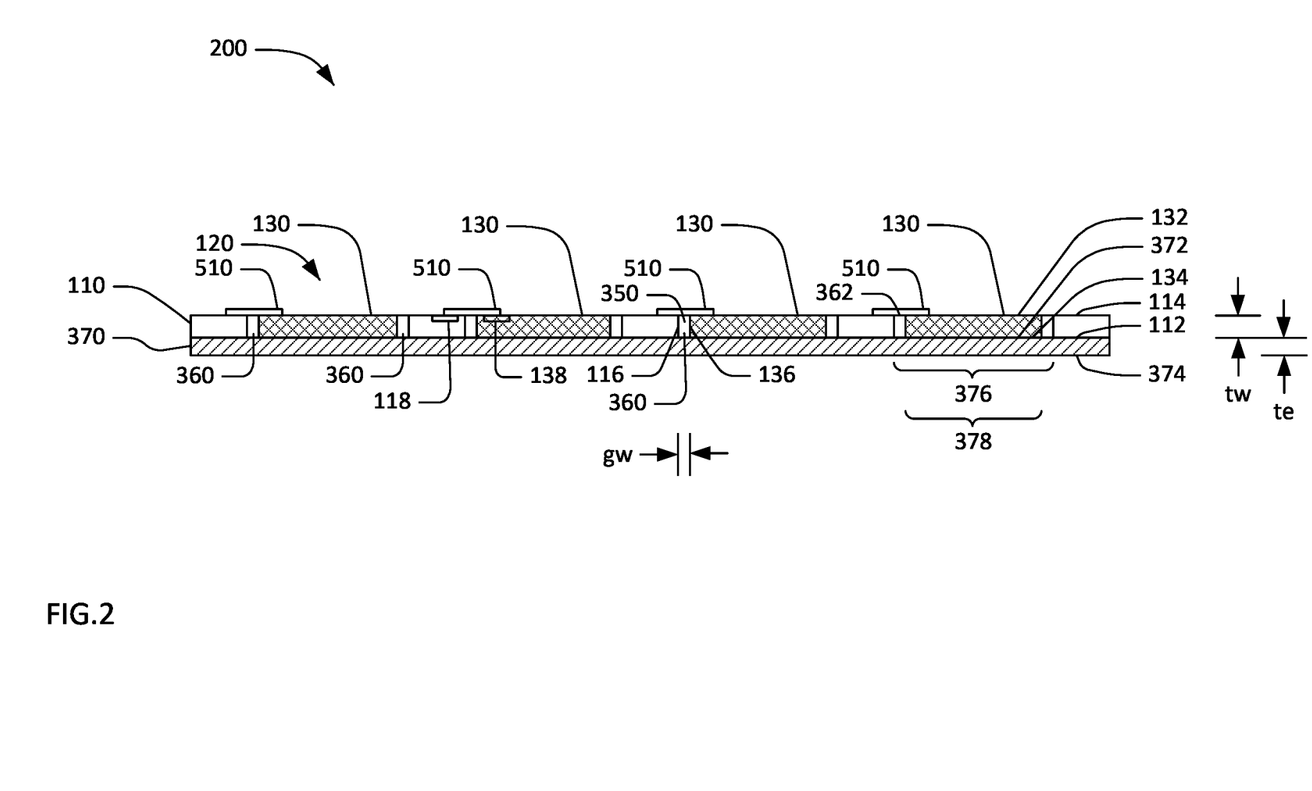
FIG. 2 is a schematic cross-sectional view of a device having in-substrate chiplet integration into wafer cavities of a host wafer using lateral dielectric material.

FIG. 1A is a schematic top view 100 of a host wafer 110 having cavities 120 for in-substrate chiplet integration into the wafer cavities 120 of a host wafer 110 using lateral dielectric material. Host wafer 110 has back surface 112 and front surface 114 as shown in FIG. 2. Host wafer 110 and/or each cavity 120 has side surfaces 116, such as a vertical or sidewall surfaces between the back surface 112 and front surface 114. There may be 3, 4 or more side surface 116. Typically, there are 4 side surfaces.

Wafer 110 may be or include (e.g., as a mixture of materials or as material layers) silicon, silicon germanium, silicon on insulator, gallium arsenide, indium phosphide, aluminum nitride, diamond, silicon carbide, quartz, alumina. If the wafer only contains interconnections and passive components, it can be a dielectric such as glass, quartz, alumina, or another ceramic. The host wafer 110 may have layers of one or more of these materials in the form of an oxide material, crystalline material and polycrystalline material and/or amorphous material. Wafer 110 may include at least one of resistors, capacitors, inductors, through substrate vias, dielectric layers, metal layers (e.g., signal traces or signal planes). Wafer 110 may include at least one layer of silicon, silicon carbide (SiC), quartz, or another semiconductor wafer material.

Wafer 110 may include areas to be diced into integrated circuits, each having passive integrated components (e.g., signal traces, interconnects and conductive vias, resistors, inductors and/or capacitors), a single transistor and/or a plurality of transistors. Silicon is an advantageous choice for wafer 110, because it takes advantage of having a lower expense than other materials; and/or of known microelectronics fabrication processes and of scaling and manufacturing capabilities.

Figure 1B:
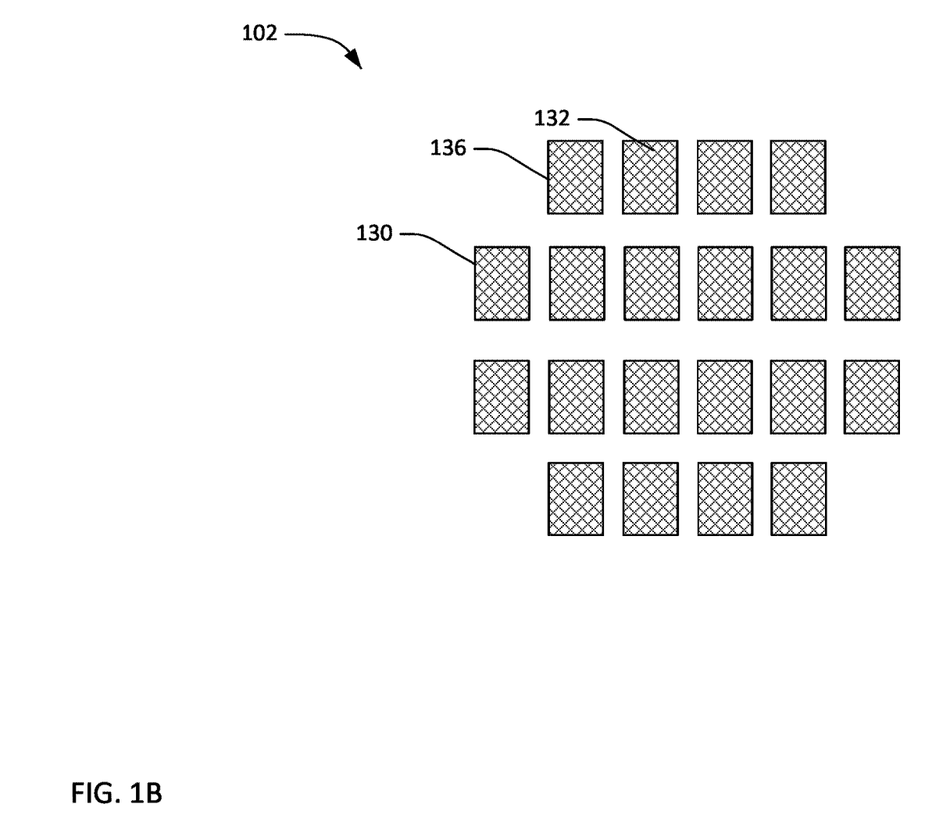
FIG. 1B is a schematic top view of chiplets for in-substrate chiplet integration into wafer cavities of a host wafer using lateral dielectric material.

FIG. 1B is a schematic top view 102 of chiplets 130 for in-substrate chiplet integration into wafer cavities 120 of a host wafer 110 using lateral dielectric material. Chiplets 130 have frontside 132 (e.g., a frontside surface) and backside 134 (e.g., a backside surface) as shown in FIG. 2. Each chiplet 130 has side surfaces 136, such as a vertical or sidewall surfaces between the frontside surface 132 and backside 134. There may be 3, 4 or more side surface 136. Sometimes there are 4 side surfaces. The number of side surfaces 136 of each chiplet 130 may be the same as the number of surfaces 116.

Chiplets 130 may each be or include (e.g., as a mixture of materials or as material layers) silicon, silicon germanium, silicon-on-insulator, gallium arsenide, indium phosphide, aluminum nitride, quartz, alumina, gallium nitride, silicon carbide. The chiplets 130 may have layers of one or more of these materials in the form of an oxide material, crystalline material and polycrystalline material and/or amorphous material. There may be different electrical component ones or types of chiplets 130 that are manufactured separately from each other. Chiplets 130 can include a GaN, InP or GaAs or any other industry-known electrical component and can be fabricated on a substrate such as Si, SiGe, InP, GaAs, SiC, Alumina, or diamond, or any other substrate known in the industry.

Chiplets 130 or types of chiplets 130 may include RF switches, transmit and/or receive circuits; power switches, amplifiers and circuits such as using GaAs, InP, GaN; and/or transistors such as Si CMOS transistors. They may have smaller and more expensive electrical components than those of wafer 110. There may be hundreds, thousands or hundreds of thousands of chiplets 130 embedded in one wafer 110. Wafer 110 may have more passive components, lower cost components, routing (e.g., traces, conductive vias and interconnections) than those of chiplets 130. Wafer 110 may be fabricated using different microelectronic fabrication techniques or processes than used to fabricate chiplets 130.

Chiplets 130 and wafer 110 can be made of different materials. For example, wafer 110 can be a silicon wafer while chiplets 130 can be a type III-Nitride material component chip. Chiplets 130 may each be or include an integrated circuit having passive integrated components (e.g., signal traces, interconnects and conductive vias, resistors, inductors and/or capacitors), a single transistor and/or a plurality of transistors.

The chiplets 130, each include at least one of transistor circuitry and interconnects to contact pads on a frontside 132 of the chiplets 130. The chiplets 130 may be high-end pre-fabricated active device chiplets that are integrated into wafer 110 through pick and place assembly on temporary wafer with an adhesive laminate or simply on an adhesive laminate 340 (see FIG. 3B).

FIG. 2 is a schematic cross-sectional view of a device 200 having in-substrate chiplet 130 integration into wafer cavities 120 of a host wafer 110 using lateral dielectric material 360. Device 200 may include the devices of FIGS. 1A and 1B.

Device 200 may be an electronic assembly having a backside capping layer 370 having a top surface 372 and a back surface 374. Device 200 has a host wafer 110 having back surface 112 and front surface 114, with the back surface 112 of the wafer bonded to the top surface 372 of a backside capping layer 370 except for cavities 120 in the wafer 110 formed over a plurality of areas 376 of the top surface 372. The cavities may extend from back surface 112, through the wafer and to front surface 114. The cavities have side surfaces 116. The back surface 112 of the wafer may be directly attached to and touching the top surface 372. The bond between the back surface 112 and the top surface 372 may be a covalent, chemical or atomic bond.

Chiplets 130 or a plurality of chips have a backside 134 and a frontside 132, with the backsides 134 of the chiplets 130 bonded directly to at least portion 378 of the plurality of areas 376 of the top surface 372 of the backside capping layer. Portion 378 may be the footprint of the chiplet 130 on top surface 372 within the cavity 120. A gap 350 between side surfaces 116 and 136 may be the difference between area 376 and portion 378. The backside 134 may be directly attached to and touching the top surface 372. The bond between the backside 134 and the top surface 372 may be a covalent, chemical or atomic bond.

The cavities 120 may be through-substrate holes or through substrate holes etched in the wafer at the areas 376. The, chiplets 130 may be embedded into the wafer 110 at the substrate holes or at cavities 120.

A lateral dielectric material 360 extends between side surfaces 136 of the chiplets 130 and the side surfaces 116 of the wafer or cavities. The lateral dielectric material 360 may mechano-chemically bond the side surfaces 136 of the chiplets 130 to the side surfaces 116 of the wafer. The lateral dielectric material 360 may form a mechanical and/or a chemical bond to the side surfaces 136 and to the side surfaces 116. In some cases, the lateral dielectric material 360 is a molded material and the bonding is a mechano-chemical bond.

Dielectric material 360 is not a metal and is an electrical insulator. Dielectric material 360 may be or include material that is not conductive, is not a semiconductor, is a plastic, is not an alloy, is a bio-material. Material 360 may be an epoxy. It may be epoxy with a silica particles. It may be epoxy with a SiO2 particles.

Material 360 may have dielectric characteristics such that when placed in an electric field, the electric charges do not flow through the material. Electric charges slightly shift from their average equilibrium positions, causing dielectric polarization that causes positive charges to flow in the direction of the field and negative charges to shift in the opposite direction of the field. This phenomenon yields an internal electric field, which in turn reduces the overall electric field within the dielectric material.

In some cases, material 360 may have no current flow through it when a voltage is applied. However, certain changes do happen at the atomic scale. When a voltage is applied across a dielectric object, it becomes polarized. Since atoms are made of a positively charged nucleus and negatively charged electrons, polarization is an effect which slightly shifts electrons towards the positive voltage. They do not travel far enough to create a current flow through the material—the shift is microscopic, but has a very important effect. Once the voltage source is removed from the material, it either returns to its original non-polarized state, or stays polarized if the molecular bonds in the material are weak. The dielectric materials may be an insulators, but one that is easily polarized.

In some cases, the dielectric material 360 has a coefficient of thermal expansion between or equal to one of those of the wafer 110 and of the chiplets 130.

The lateral dielectric material 360 is disposed in gaps 350 between the side surfaces 136 of each of the chiplets 130 and the side surfaces 116 of the corresponding wafer cavity that each chiplet 130 is disposed in. The gap 350 has a width gw of between $\frac{1}{5}$ (one fifth) and 10 times a thickness tw of the wafer 110 or chiplets 130.

The thickness tw of the wafer may be between 20 and 200 microns. It may be between 50 and 125 um. It may be 75 um. The thickness of one, many or all of the chiplets may be that same as that of the wafer.

A thickness to of the backside capping layer may be between 3 and 300 microns. It may be between 5 and 100 microns. It may be between 10 and 50 microns. It may be 15 um.

Each of the chiplets 130 have between 3 and 6 sides. They may have 4 sides. The sides may be straight, curved or wavy in profile as viewed from a top perspective. The cavities 120 may have the same number of and sides corresponding to the shapes of the sides of the chiplets 130.

The backside capping layer 370 may be is a high-thermal-conductivity backside metallization layer that improves heat transfer from the chiplets 130 to the wafer 110. Layer 370 may be a thermal plane that improves heat conduction away from the chiplets by increasing thermal conduction from the chiplets 130 and to layer 370 and/or wafer 110. Layer 370 be a material in direct contact with the chiplets 130 to increase thermal conduction between the materials of the chiplets 130 and that of layer 370. In some cases, the backside capping layer 370 has a coefficient of thermal expansion between those of or equal to one of those of the wafer 110 and of the chiplets 130.

Interconnects 510 may be formed directly on the lateral dielectric material 360 and connect electrical (e.g., power, ground and/or signal) contacts 138 of the chiplets 130 to contacts 118 of the wafer 110. Interconnects 510 may include direct interconnect routing or traces that is formed directly on the lateral dielectric material (e.g., without any dielectric/air gap), and that extends from the chiplets to wafer electrical routing. The interconnect routing may include low loss high-performance DC, RF, and mm-wave routing from the chiplets 130, directly on the lateral dielectric material, and to wafer electrical routing. Interconnects 510 may be directly on material 360 by being bonded to and/or directly attached to (e.g., touching) the top surface of the lateral dielectric material 360.

In some cases, wafer 110 includes an electronic integrated circuit (not shown), at least one integrated circuit contact 118 (e.g., contact pad) formed on the front wafer surface 114, and at least one through-wafer cavity 120 having side surface 116 that join back surface 112 to front surface 114. In some cases, a chiplet 130 is held in the through-wafer cavity 120 by a lateral dielectric material 360 that attaches at least one side surface 116 of the through-wafer cavity 120 to at least one side surface 136 of the chiplet 130. In some cases, lateral dielectric material 360 fills gap 350 of the cavity, thus attaching most of the side surfaces 136 of chiplet 130 to the side surfaces 116 of through-wafer cavity 120; however material 360 does not attach the backside 134 of chiplet 130 to top surface 372 of layer 370.

A passivation layer (not shown) can be arranged on most of the front surface 114 of wafer 110. Conducting vias (e.g., TWVs) arranged through the passivation layer can connect the active and/or passive circuitry of wafer 110 to contacts 118 (e.g., contact pads) on front surface 114. Wafer 110 can be a silicon wafer or substrate, which allows taking advantage of known fabrication processes and manufacturability on large wafer diameters.

It is noted that wafer 110 can include any integrated circuit, active or passive, made possible by a chosen manufacturing process; for example, a CMOS manufacturing process. In some cases, the thickness of the one or more integrated circuit layers can for example be only a fraction of the thickness tw of wafer 110 (for example between $\frac{1}{10}$ and $\frac{1}{1000}$ of the thickness of wafer 110; for example 50 nm thick with a wafer 50 µm thick). In some cases, the thickness of wafer 110 can be reduced after fabrication of integrated circuits of the wafer and for example before etching the through-wafer cavity 120 or after filling gap 350 with lateral dielectric material 360.

Chiplet 130 may include one or more transistors (not shown) having its terminals connected to at least one integrated circuit contact 138 (e.g., contact pad), such as by a conductive via (not shown). Chiplet 130 can comprise a substrate and integrated circuit layers formed on top of its substrate, the thickness of the integrated circuit layers being for example only a fraction of the thickness of the substrate (for example between $\frac{1}{10}$ and $\frac{1}{1000}$ of the thickness of the substrate). In some cases, the total thickness of chiplet 130 is smaller than the total thickness of host wafer 110. In some cases, lateral dielectric material 360 contacts the side surfaces 136 of chiplet 130 along most of their height (at least 50% of the height, starting from close to the top surface of chiplet 130). Preferably, lateral dielectric material 360 contacts essentially all of the side surfaces 136 of chiplet 130. Preferably, lateral dielectric material 360 fills completely gap 350, up to a level essentially flush with the front surface 114 of host wafer 110.

In some cases, lateral dielectric material 360 holds the chiplet 130 such that the chiplet frontside 132 is flush with the front surface 114. Being "flush" may be understood as meaning that the two surfaces are in a same plane, or have, with respect to each other, a small or negligible height difference. The two surfaces may be flush, such as resulting from the process of material 360 permanently attaching chiplet 130 to the side surfaces 116 of through wafer cavity 120 while both the chiplet frontside 132 and the front surface 114 are attached temporarily to an adhesive laminate 340 (see FIGS. 3A-3F), for example according to a process as illustrated herein. The frontside 132 and the front surface 114 may be flush, such as resulting from polishing or CMP of those surfaces after removing the temporarily adhesive laminate 340.

In some cases, layer 370 has flat planar, continuous surface and a constant thickness te, such as where the back surfaces 112 of the chiplets and backside surface 134 of the wafer are all at the same vertical, planar level. In other cases, layer 370 has a non-flat surface and a non-constant thickness, such as where the back surfaces 112 of the chiplets and/or backside surface 134 of the wafer vary in height and are not planar. In one case, the thickness te of layer 370 varies between the chiplets and wafer by being a certain thickness for the wafer and having another thickness for one or more chips. in other words, the wafer and some of the chiplets have different thicknesses. In this case, some of the chiplets may have different thicknesses than other chiplets.

It is considered that the host wafer 110 can be vertically diced at dicing lines (shown by the vertical bars in FIG. 2) along a perimeter 386 of the wafer around at least one chiplet to form a chip having the at least one chiplet and an area of the wafer surrounding the at least one chiplet.

DESCRIPTION OF METHODS

FIGS. 3A-3F are a flow diagram showing a process of steps 301-306 for fabrication of a device 200 having in-substrate chiplet integration into wafer cavities of a host wafer using lateral dielectric material. The process may form device 200 using the devices of FIGS. 1A and 1B. The process starts with device 311 and ends with device 200. The process may be a method of forming or assembling an electronic assembly or device. The process may be a lateral chiplet dielectric bonding process. The flow chart of FIGS. 3A-3F includes only major process steps. Various conventional process steps (e.g. surface preparation, chemical mechanical processing (CMP), cleaning, inspection, deposition, photolithography, baking, annealing, monitoring, testing, etc.) may be performed before, between, after, and during the steps shown in FIGS. 3A-3F.

Figure 3A:
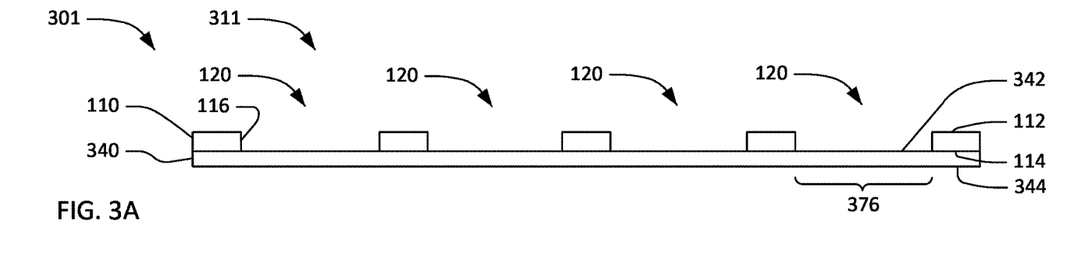
FIGS. 3A-3F are a flow diagram showing a process for fabrication of a device having in-substrate chiplet integration into wafer cavities of a host wafer using lateral dielectric material.

FIG. 3A shows step 301 for forming device 311, which includes a host wafer 110 bonded to an adhesive laminate 340. Step 301 may include forming cavities 120 through a host wafer 110 having back surface 112 and front surface 114, the cavities having side surfaces 116. Forming the cavities 120 may include etching through-substrate holes in the back surface 112 of the wafer.

Step 301 then includes bonding a front surface 114 of the wafer to a top surface 342 of an adhesive laminate 340 having the top surface 342 and a bottom surface 344 such that the cavities 120 are disposed over a plurality of areas 376 of the top surface 342 of the adhesive laminate. Bonding at step 301 may include directly attaching the front surface 114 of the wafer to the top surface 342 such that front surface 114 is bonded to and touching top surface 342, except for the cavities 120 or areas 376. The bond between the front surface 114 and the top surface 342 may be a covalent, chemical or atomic bond. In some cases, cavities 120 may be formed after bonding wafer 110 to laminate 340.

Laminate 340 may include at least one of an adhesive, an epoxy, a sacrificial layer on a wafer, a water-soluble adhesive, a solvent-dissolvable adhesive, a UV-releasable adhesive, or a heat-releasable adhesive.

Step 301 may include the placement of the host wafer 110 with through-substrate holes 120, such as placement onto laminate 340, or lamination of laminate 340 onto the surface of wafer 110 to form device 311. The holes 120 may have a minimum of one sides (e.g., may be a circle) and up to an infinite number of sides, but preferably have 4 sides. The wafer thickness tw may be from 10 to 2,000 microns, but preferably 75 um.

Figure 3B:
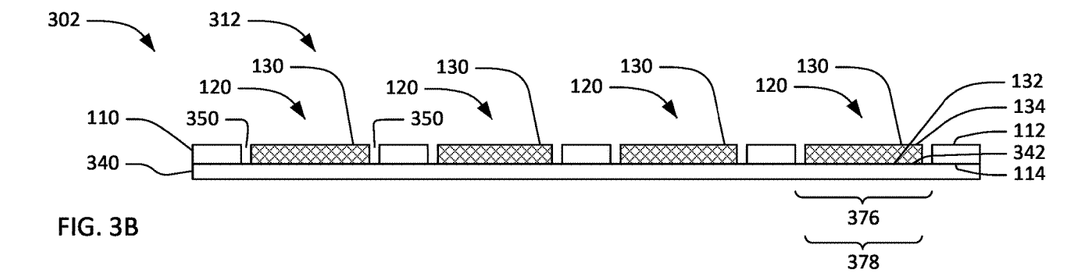

FIG. 3B shows step 302 for forming device 312, which includes chiplets 130 bonded to top surface 342 within cavities 120. Step 302 may include bonding a frontside 132 of a plurality of chiplets 130 having the backside 134 and a frontside 132 to a portion 378 of the plurality of areas 376 of the top surface 342 of the adhesive laminate 340. Bonding at step 302 may include directly attaching the frontsides 132 of the chiplets 130 to the portions 378 of the of areas 376 such that frontside 132 is bonded to and touching top surface 342 within the cavities 120. The bond between the frontside 132 and the top surface 342 may be a covalent, chemical or atomic bond.

The chiplets 130, typically have 4 sides, but could have anywhere between 0 and an infinite number of sides that are then aligned with and bonded into the through-substrate holes 120 of device 311, face down (e.g., flip chip bonding) onto the adhesive laminate material 340. The chiplets 130 can be of the same thickness tw or thicker or thinner than the thickness tw of wafer 110.

Bonding at step 302 may include pick and place assembling a high-end pre-fabricated chiplet 130 into the cavities 120 of the top surface 342 of the adhesive laminate 340.

Each chiplet 130 may include at least one of active device circuitry and interconnects to contact pads on a front surface of the chiplet. Each chiplet 130 may be a pre-fabricated transistor chiplet.

Figure 3C:
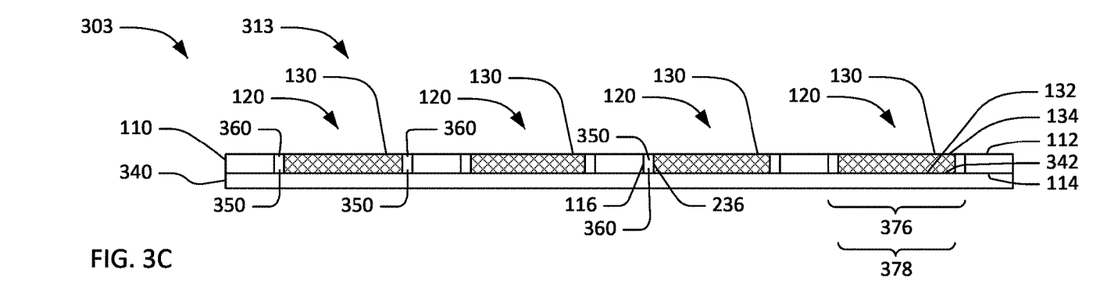

FIG. 3C shows step 303 for forming device 313, which includes lateral dielectric material 360 molded between chiplets 130 and wafer 110 within cavities 120. Step 303 may include molding a lateral dielectric material 360 between side surfaces 236 of the chi pets 130 and the side surfaces 116 of the wafer 110 within the cavities 120. The lateral dielectric material 360 may mechano-chemically bond the side surfaces 136 of the chiplets 130 to the side surfaces 116 of the wafer. The lateral dielectric material 360 may fill gaps 150 between the chiplets 130 and the wafer 110. The lateral dielectric material 360 may completely fill gap width gw and thickness tw of gaps 150.

Molding at step 303 may include directly attaching the material 360 to side surfaces 136 of the chiplets 130, top surface 342 of the adhesive 340, and side surfaces 116 of the wafer 110 such that material 360 is touching side surfaces 136, top surface 342 and side surfaces 116. The bond between the material 360, side surfaces 136, top surface 342 and side surfaces 116 may be an a covalent, chemical or atomic bond. It may be an adhesive bond formed by pressure forming the material 360 into gaps 350.

Figure 4A:
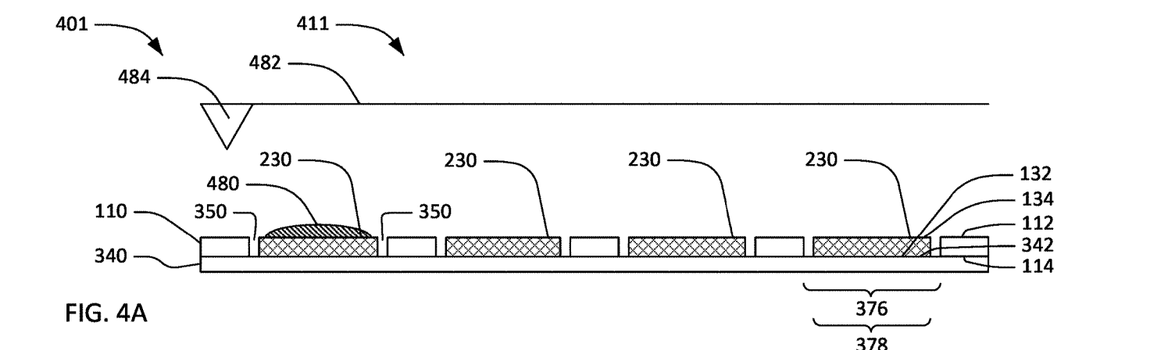
FIGS. 4A-4C are diagrams showing two processes for forming the device of FIG. 3C.
Figure 4B:
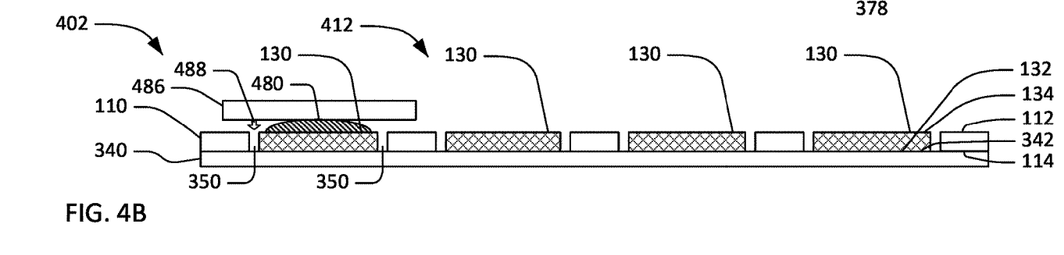
Figure 4C:
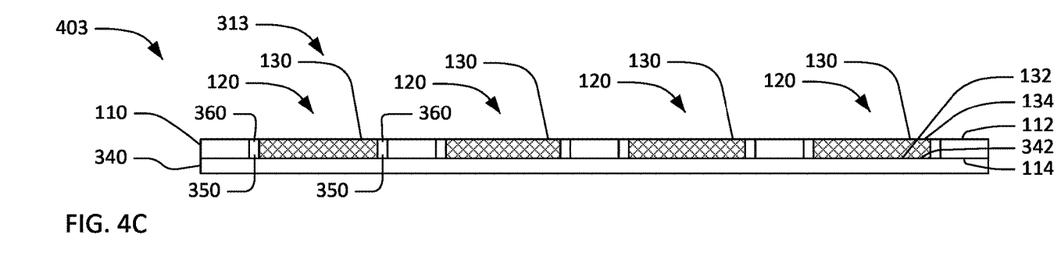

Step 303 may be performing a lateral chip bonding process that bonds chiplets 130 to wafer 110 of device 312 (e.g., see FIGS. 4A-4C for details). The aspect ratio, as defined by ratio of the thickness tw of the wafer (or chip) to the width gw of the gap 150 (e.g., the minimum distance between the vertical side of the chip 236 and the side of the through-hole 116) can be on the order of 100:1, but typically would be 10:1. In some cases, thickness tw is 1000 um and width gw is 10 um.

FIGS. 4A and 4B are flow diagrams showing two processes for the step 303 forming device 313 of FIG. 3C also shown at FIG. 4C. The FIGS. 4A and 4B processes may form device 313 by molding a lateral dielectric material 360 into gaps 350. The flow chart of FIGS. 4A-4C includes only major process steps. Various conventional process steps (e.g. surface preparation, chemical mechanical processing (CMP), cleaning, inspection, deposition, photolithography, baking, annealing, monitoring, testing, etc.) may be performed before, between, after, and during the steps shown in FIGS. 4A-4C.

FIG. 4A shows step 401 for forming device 411, which includes a bump 480 of the lateral dielectric material 360 printed onto a chiplet backside 134 or a wafer back surface 112. Step 401 may include using a printing process to print the bump 480 of the lateral dielectric material 360 into gaps 350 between the side surfaces 136 of the chiplets and the side surfaces 116 of the wafer 110 using a permanent screen, such as using the wafer with cavity as a screen to be printed on by the printer.

Step 401 may include a screen-printing process, where 484 may be a squeegee that spreads a ball 480 of bonding material over the surfaces 134 and 112, and into the gaps 350 as shown in FIG. 4C. Thus, FIG. 4A is a step of the process prior FIG. 4C where a bump of adhesive 480 no longer exists.

Step 401 may include using a printer 482 with printhead 484 that prints a bump 480 of the material 360 on the back surface and into the gaps 350.

FIG. 4B shows step 402 for forming device 412, which includes the bump 480 of the lateral dielectric material 360 pressured onto the backside 134 of device 411. Step 402 may include using a molding process to mold the bump 480 of the lateral dielectric material 360 into gaps 350 between the side surfaces 136 of the chiplets and the side surfaces 116 of the wafer 110 using a vacuum and pressure. The molding may be done using a liquid compression molding technique such as liquid composite molding (LCM).

Printing at 401 and/or molding at 402 may us a squeegee or a squeegee process to print the bump 480 and/or mold the bump 480 into gaps 350.

After either of step 401 or 402, FIG. 4C shows step 403 for forming device 313 of FIG. 3C. Either of step 401 or 402, may include mechano-chemically bonding bump 480 between side surfaces 236 of the chiplets 130 and the side surfaces 116 of the wafer 110 within the cavities 120 to form the lateral dielectric material 360. Step 403 may include heating and/or curing of the molding of step 401 or 402.

Figure 3D:
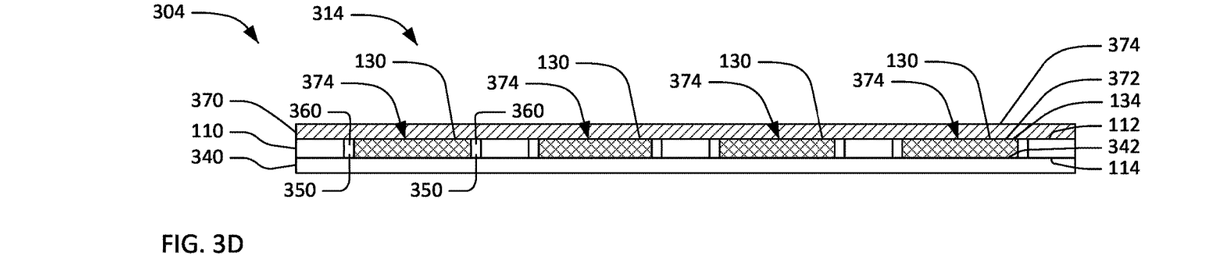

After step 303, FIG. 3D shows step 304 for forming device 314, which includes a backside capping 370 encapsulating the backside 134 of the chiplets, the back surface 112 of the wafer 110 and the top surfaces of the lateral dielectric material 360. Step 304 may include encapsulating the backside 134, the back surface 112 and on the top surfaces of the lateral dielectric material 360 with a backside capping layer 370 having a top surface 372 and a back surface 374, such that the areas of cavities 120 are disposed over areas 376 of the top surface 372 of the backside capping layer 370. As shown, portions 376 and areas 378 may be vertically aligned with respect to laminate 340 and layer 370.

Encapsulating at step 304 may include directly attaching the backside 134, the back surface 112 and on the top surfaces of the lateral dielectric material 360 to backside capping layer 370 such that layer 370 is touching backside 134, back surface 112 and the top surfaces of material 360. Encapsulating at step 304 may include embedding the chiplets 130 into the wafer 110 at the holes or at cavities 120.

Encapsulating at step 304 may include encapsulating the restructured wafer/panel device 313 with a metallic version of layer 370 acting as a thermal plane, preferably having thickness to in the order of 5-25 microns thick, and making direct contact with the backside face 134 and front surface 114 of the chips 130 and of the wafer 110.

The backside capping layer 370 may be a high-thermal-conductivity backside metallization layer that improves heat transfer away from the chiplet, such as to the wafers. It may form a "thermal plane" to conduct heat away from the chiplets. The backside capping layer 370 may have a coefficient of thermal conductivity greater than those of the wafer and of the chiplets. The backside capping layer 370 may have a coefficient of thermal expansion between those of the wafer and of the chiplets.

Figure 3E:
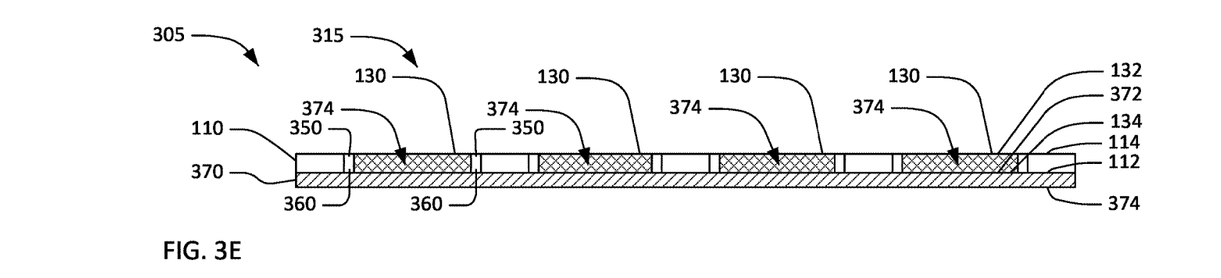

FIG. 3E shows step 305 for forming device 315, which does not include adhesive laminate 340, but does include layer 370 on the chiplets 130, on the wafer 110 and on the lateral dielectric material 360. FIG. 3E shows device 314 inverted and without laminate 340, Step 305 may include removing or detaching the adhesive laminate 340 from the surfaces of the chiplets 130, wafer 110 and lateral dielectric material 360 using a bath, liquid and/or heat. Step 305 may be the removal of the adhesive laminate 340 from device 314.

Because chiplet 130 is then attached inside cavity 120 by material 360, chiplet 130 is maintained in cavity 120 in the position it had relative to wafer 110 when they were attached to laminate 340.

The chiplets 130 and wafer exposed bottom surfaces may be polished such as by chemical mechanical polishing (CMP) after laminate 340 is removed. In other cases, they are not polished. The exposed surfaces 132 may be surfaces with the electrical components that are then interconnected with the conductors 510 added in FIG. 3F. In some cases, chiplet 130 can be arranged such that a surface fabricated as a side surface is arranged and maintained parallel to the front surface of wafer 110. This capability can be used to increase the number of component chiplets 130 embedded in wafer 110, and/or when the side surface of chiplet 130 maintained parallel to the front surface of wafer 110 has a specific function. This might be the case, for example, when chiplet 130 is a semiconductor laser chip and its side surface is a laser emitting side.

Figure 3F:
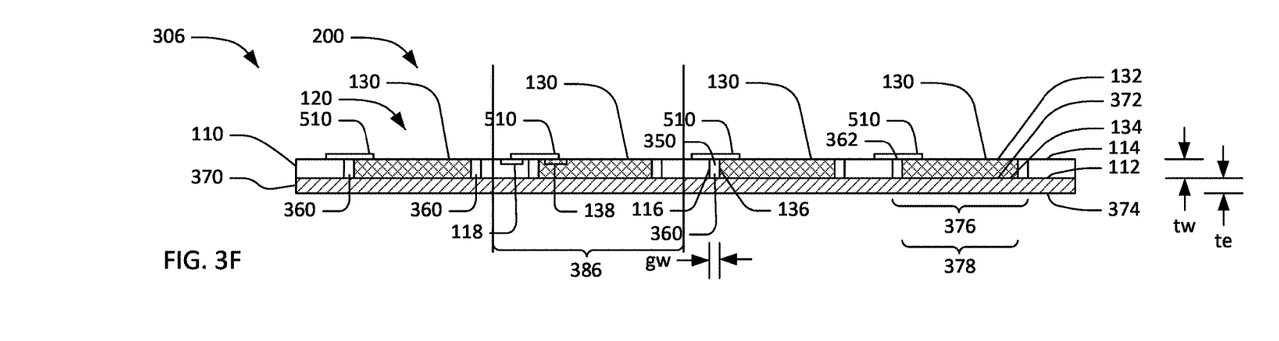

FIG. 3F shows step 306 for forming device 316, which includes interconnects 510 connecting contacts 118 of the chiplets to contacts 138 of the wafer. Step 306 may include forming interconnects 510 directly on the lateral dielectric material 360 and connecting the contacts of the chiplets to contacts of the wafer. Interconnects 510 may be formed by electroplating a pattern of interconnects 510 through a photoresist and then dissolving the photoresist. Interconnects 510 may be formed by deposition of, masking over the pattern of interconnects 510 and etching away non-patterned parts of a conductive material such as a metal.

Beneficially, interconnects 510 can be formed without the cost, processing or material height of using solder or contact bumps on contacts of either the chiplets 130 or the wafer 110.

Forming at step 306 may include directly attaching the interconnects 510 to the material 360 such that the interconnects 510 are touching the top surface of material 360. Forming at step 306 may include forming direct interconnect 510 routs or traces from the contacts 138 of chiplets 130, directly on (e.g., bonded to, directly attached to, touching and/or with no air gap between the interconnect and the dielectric) the lateral dielectric material 360, and to wafer electrical routing or contacts 118.

It is considered that the host wafer 110 can be vertically diced at dicing lines (shown by the vertical bars in FIG. 3F) along a perimeter 386 of the wafer around at least one chiplet to form a chip having the at least one chiplet and an area of the wafer surrounding the at least one chiplet.

FIGS. 2 and 3F may shows how the interconnect structure 510 directly sits on top of the dielectric bonding material 360 between the chiplets 130 and wafer 110.

Beneficially, the step 303 lateral mechano-chemical chiplet bonding and/or use of the dielectric 360: (1) is low cost such as by using low cost processes of step 303 and materials such as dielectric 360; and (2) is volume-scalable such as by allowing the size and number of chiplets 130 to be easily changed. Beneficially, the step 303 lateral mechano-chemical chiplet bonding and/or use of the dielectric 360 mitigates coefficient of thermal expansion mismatch between the silicon wafer frame 110 and the chiplets 130, such as by the dielectric 360 having a coefficient of thermal expansion close to one of, or between that of, wafer 110 and the chiplets 130. Beneficially, the step 303 lateral mechano-chemical chiplet bonding and/or use of the dielectric 360 allows: (1) direct interconnect routing from the chiplets 130 to the wafer 110 electrical routing (e.g., with no dielectric/air gap); and (2) low loss high-performance DC, RF, and mm-wave signal transfer between the chiplets 130 and the wafer 110 electrical routing, where (1) and (2) can use interconnects 510 between contacts of the chiplets 130 and wafer 110 that can be formed on the surface of dielectric 360.

Beneficially, the step 303 lateral mechano-chemical chiplet bonding and/or use of the dielectric 360, as compared to using a semiconductor or conductor material in place of dielectric 360, reduces noise and changes in frequency in interconnect routing from the chiplets 130 to the wafer 110 electrical routing. Beneficially, the step 303 lateral mechano-chemical chiplet bonding and/or use of the dielectric 360, as compared to using a semiconductor or conductor material in place of dielectric 360, reduces capacitance in high frequency signals and has lower signal loss in interconnect routing from the chiplets 130 to the wafer 110 electrical routing. Beneficially, the step 303 lateral mechano-chemical chiplet bonding and/or use of the dielectric 360, as compared to using a semiconductor or conductor material in place of dielectric 360, reduces the cost of the material of and processing for forming the lateral bonding material between the chiplets 130 and the wafer 110.

In addition to those benefits, that lateral mechano-chemical dielectric bonding process is augmented by benefits of steps 304-304 and/or use of backside capping layer 370 which provide: a high-thermal-conductivity backside metallization 370 of the restructured wafer 314 or 200 to improve heat transfer from the chiplets 130 to the wafer 110 and layer 370 which may be a "thermal plane" for the device 200.

According to the process 301-306, a plurality of electronic assemblies can be manufactured simultaneously, in which case pluralities of component chiplets 130 are provided and attached to a plurality of predetermined locations (e.g., of areas 378) on laminate 340. The chiplet 130 can actually comprise a plurality of identical or distinct component chips, each having each their frontside 132 attached temporarily to the predetermined locations of top surface 342. In some cases, the various component chips can have different thicknesses, subject to the constraint that they be no thicker than wafer 110.

Chiplets 130 are preferably pre-tested to verify their functionality. As a result, the yield of the final device 200 or diced devices is much improved over integration of component chips, in which the functionality of the component chips is not verified until after integration.

Embedding of a chiplet 130 (comprising a single chip or a plurality of component chips, etc.) in a dielectric 360 filled cavity 120 allows a desirable increase in the drain of any chip-produced heat to the wafer 110 during use of the chiplet. The increased drain significantly beneficially limits any change in size of the chiplet due to a temperature change and allows any mechanical strain due to such size change to beneficially remain moderate. Another advantage is that the dielectric 360 may be resilient and pliable to better absorb the size change. This heat drain is improved by connecting the bottom of the chiplet 130 to a metal backside capping layer 370, such as a metal plate, formed on a portion of the bottom surface of wafer 110. As illustrated in FIG. 3, backside capping layer 370 of metal (for example, gold) can be formed on the bottom of chiplet 130 and wafer 110. Doing so improves the thermal conductivity and interface between chiplet 130, material 360 and wafer 110, thus further increasing the desirable drain of any chip-produced heat from the chiplet and to the layer 370 during use of the chiplet.

Advantageously, by allowing different electrical component ones of chiplets 130 to be manufactured separately from each other and from wafer 110, electronic components of those all chiplets 130 and wafer 110 can be tested separately before assembling them. In case one of the components of a certain electrical component chiplet 130 or of wafer 110 has poor fabrication yields, it is possible to separately spend time and money to improve the fabrication yield of that electrical component separately to produce a completed product device 200 or die thereof, having the chiplets 130 together in the cavities of the wafer 110. For example, If an electrical component of a certain chiplet type of the chiplets 130 has poor fabrication yield, it is possible to separately spend time and money to improve the fabrication yield of that electrical component chiplet type without spending time and money to improve the components of the other types of chiplets 130 or of wafer 110, to produce a completed product device 200 or die thereof, having the chiplets 130 and wafer 110.

Further, because embodiments allow fabricating different electrical component ones of chiplets 130 separately from each other and from wafer 110, all of the component types of chiplets 130 and wafer 110 do not need to be exposed to steps in the fabrication of all the different electrical component ones of chiplets 130 that could potentially damage other ones of chiplets 130 or damage wafer 110.

Thus, embodiments can reduce manufacturing costs by using small component chips in chiplets 130 having specific features and made of exotic expensive materials, in combination with integrated circuits of other chiplets 130 and/or wafer 110 having more common features and made of cheaper common materials.

According to embodiments, chiplets 130 can include a GaN, InP or GaAs electrical component and can be fabricated on a substrate such as Si, SiGe, InP, GaAs, Alumina, or diamond. In some cases, electrical components or integrated circuits of host wafer 110 can comprise metal routing and passive components fabricated at the wafer scale. In some cases, interconnection 510 can be made using conductors made out of thin films, thick, plated interconnects, multi-layers, etc. The interconnections can for example be made using the back-end steps of a manufacturing process.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A method of assembling an electronic assembly comprising:
    bonding a front surface of a wafer having the front surface, a back surface, and cavities having side surfaces of the wafer to a top surface of an adhesive laminate having the top surface and a bottom surface such that the cavities are disposed over a plurality of areas of the top surface of the adhesive laminate;
    bonding a frontside of a plurality of chiplets having a backside and the frontside to a portion of the plurality of areas of the top surface of the adhesive laminate; and
    molding a lateral dielectric material between side surfaces of the chiplets and the side surfaces of the cavities, the lateral dielectric material bonding the side surfaces of the chiplets to the side surfaces of the cavities; and
    forming direct interconnects of conductive material from the chiplets, directly on the lateral dielectric material, and to wafer electrical routing of the wafer.

2. The method of claim 1, further comprising:
    encapsulating the backside of the chiplets, the lateral dielectric material and the back surface of the wafer on a top surface of a backside capping layer having the top surface and a back surface; and
    removing the adhesive laminate.

3. The method of claim 2, wherein:
    bonding the front surface of the wafer to the top surface of the adhesive laminate includes directly attaching the front surface of the wafer to the top surface of the adhesive laminate except for the cavities,
    bonding the frontside of the plurality of chiplets to the portion of the plurality of areas includes directly attaching the frontside of the chiplets to the plurality of areas of the top surface of the adhesive laminate, and
    encapsulating the backside of the chiplets, the lateral dielectric material and the back surface of the wafer on the top surface of the backside capping layer includes directly attaching the backside of the chiplets, the lateral dielectric material and the back surface of the wafer to the top surface of the backside capping layer.

4. The method of claim 1, wherein molding the lateral dielectric material includes one of:
    printing the lateral dielectric material into gaps between the side surfaces of the chiplets and the side surfaces of the wafer using a permanent screen; or
    molding the lateral dielectric material into gaps between the side surfaces of the chiplets and the side surfaces of the wafer using a vacuum and pressure.

5. The method of claim 1, wherein bonding the frontside of the plurality of chiplets to the portion of the plurality of areas includes pick and place assembling pre-fabricated transistor chiplets on the top surface of the adhesive laminate.

6. The method of claim 1, further comprising:
    vertically dicing a perimeter of the wafer around the chiplets to form chips having at least one chiplet and an area of the wafer surrounding the at least one chiplet.

7. The method of claim 1, wherein the direct interconnects include radio frequency (RF) interconnects connecting the plurality of chiplets and for sending RF signals between the plurality of chiplets.

8. A method of assembling an electronic assembly comprising:
    forming cavities through a wafer having a front surface and a back surface, the cavities having side surfaces of the wafer;
    bonding the front surface of the wafer to a top surface of an adhesive laminate having the top surface and a bottom surface such that the cavities are disposed over a plurality of areas of the top surface of the adhesive laminate;
    bonding a frontside of a plurality of chiplets having a backside and the frontside to a portion of the plurality of areas of the top surface of the adhesive laminate;
    molding a lateral dielectric material between side surfaces of the chiplets and the side surfaces of the cavities, the lateral dielectric material mechano-chemically bonding the side surfaces of the chiplets to the side surfaces of the cavities;
    encapsulating the backside of the plurality of chiplets, the lateral dielectric material and the back surface of the wafer on a top surface of a backside capping layer having the top surface and a back surface, wherein encapsulating the backside of the chiplets includes directly attaching a semiconductor material of the back surface of the wafer to the top surface of the backside capping layer; and
    removing the adhesive laminate.

9. The method of claim 8, wherein:
    bonding the front surface of the wafer to the top surface of the adhesive laminate includes directly attaching the front surface of the wafer to the top surface of the adhesive laminate except for the cavities,
    bonding the frontside of the plurality of chiplets to the portion of the plurality of areas includes directly attaching the frontside of the chiplets to the plurality of areas of the top surface of the adhesive laminate, and
    encapsulating the backside of the chiplets, the lateral dielectric material and the back surface of the wafer on the top surface of the backside capping layer includes directly attaching the backside of the chiplets, the lateral dielectric material and the back surface of the wafer to the top surface of the backside capping layer.

10. The method of claim 8, wherein bonding the frontside of the plurality of chiplets to the portion of the plurality of areas includes pick and place assembling pre-fabricated transistor chiplets on the top surface of the adhesive laminate.

11. The method of claim 8, further comprising:
forming a plurality of interconnects directly on the lateral dielectric material and connecting contacts of the chiplets to contacts of the wafer.

12. The method of claim 8, further comprising:
forming direct interconnects from the chiplets, directly on the lateral dielectric material, and to wafer electrical routing after removing the adhesive laminate.

13. The method of claim 8, further comprising:
vertically dicing a perimeter of the wafer around the chiplets to form chips having at least one chiplet and an area of the wafer surrounding the at least one chiplet.

\* \* \* \* \*